United States Patent [19]

Liken et al.

[11] Patent Number: 5,592,390
[45] Date of Patent: Jan. 7, 1997

[54] TIME BASED METHOD FOR ANALYZING A WAVEFORM

[75] Inventors: Peter A. Liken, West Olive; Mark C. Jacobs, Holland; Monte E. Van Nortwick, Hudsonville, all of Mich.

[73] Assignee: Venturedyne, Ltd., Milwaukee, Wis.

[21] Appl. No.: 536,443

[22] Filed: Sep. 29, 1995

Related U.S. Application Data

[63] Continuation of Ser. No. 216,409, Mar. 23, 1994, Pat. No. 5,485,078.
[51] Int. Cl.[6] .................................................. G08B 21/00
[52] U.S. Cl. .................. 364/487; 364/224.2; 364/514 A
[58] Field of Search ........................... 364/224, 224.2, 364/484, 486, 487, 603, 514 R, 514 A

[56] References Cited

U.S. PATENT DOCUMENTS 4,855,722  8/1989  Mostyn et al. .................... 340/660

OTHER PUBLICATIONS

Conte et al., Elementary Numerical Analysis, 1980, pp. 295–303.

*Primary Examiner*—Ellis B. Ramirez
*Assistant Examiner*—Craig Steven Miller
*Attorney, Agent, or Firm*—Jansson & Shupe, Ltd.

[57] ABSTRACT

A new method for analyzing an electrical waveform of the type portrayed on a graph includes the steps of selecting a waveform to be analyzed, establishing the boundary of a window-like area and generating a signal if the waveform is in a predetermined position with respect to the area. For example, a signal such as a failure signal is generated if the waveform is to be out of the area but, in fact, is in the area. The method also includes features for determining certain parameters, e.g., rise time, period and the like, for the waveform. The steps include selecting first and second points on the waveform and determining the time lapsed between points. Details regarding the structure of a new waveform analyzer are also disclosed.

6 Claims, 8 Drawing Sheets

TIME BASED METHOD FOR ANALYZING A WAVEFORM

RELATED APPLICATION

This application is a continuation of application Ser. No. 08/216,409 filed on Mar. 23, 1994, now U.S. Pat. No. 5,485,078.

FIELD OF THE INVENTION

This invention is related generally to electricity and, more particularly, to computerized measuring and testing of electrical waveforms.

BACKGROUND OF THE INVENTION

Since the advent of electronic instruments and the cathode ray oscilloscope, electrical signal (voltage or current) monitoring has been by watching an actual "trace" of the signal on a cathode ray tube or 'scope. However, as signal frequencies increased and as such signals became more complex in waveform, such equipment became less equal to the task of good waveform analysis.

Waveform "sampling" followed. Waveform analysis by sampling, which per se is performed digitally by known devices, involves picking off discrete or "sample" points of a waveform, storing those points in memory and recalling them for later analysis.

Equipment of the general type is depicted in U.S. Pat. No. 4,142,146 (Schumann et al.); U.S. Pat. No. 4,625,283 (Hurley) and U.S. Pat. No. 5,222,028 (Labarre et al.). The system and method of the LaBarre et al. patent identifies a waveform trailing edge by comparing waveform data to predetermined slope criteria. Once a trailing edge (and, thus, the end of a pulse) is identified, the immediately preceding leading edge is assumed to define the beginning of the pulse and, together with the trailing edge, defines pulse height.

Pulse width is calculated as the time between the leading edge 50% point and the trailing edge 50% point. The rise time is calculated to be the time required for the signal to rise from 10% to 90% of its normal pulse amplitude.

The Hurley patent involves an apparatus and method for measuring alternating current. Sampling of a waveform occurs as such waveform crosses negative and positive reference voltage values. The Hurley apparatus and method correlate amplitude values of the waveform with measured time intervals between crossings. The Hurley patent has what may be an ambiguity or outright error in its reference to an alternating current which crosses reference voltage values.

The Schumann et al. patent involves an apparatus which is particularly useful when the signal being analyzed has a frequency more than half the frequency of sampling. The Schumann et al. apparatus samples the waveform at irregular intervals.

While the apparatus and methods depicted in the aforementioned patents have been generally suitable for their intended purpose, they tend to be characterized by certain disadvantages. For example, the method of the LaBarre et al. patent makes certain assumptions about where a particular waveform "pulse" begins rather than taking actual "point" measurements to positively determine such beginning. And such patent also determines pulse width by techniques which may be less than precise.

Laying aside the matter of possible ambiguity or error, the method described in the Hurley patent samples a waveform as it crosses negative and positive reference voltage values. Often, there are situations where sampling is desired at other instants.

When considered in the framework of an overall system for testing printed circuit boards, e.g., a system which includes an environmental test chamber, the known prior art apparatus appears not well suited to be integrated with such system. And the known prior art apparatus and methods seem to lack flexibility in enabling determination of a wide variety of waveform parameters, e.g., rise time, fall time, frequency, period, maximum and minimum waveform values and others.

OBJECTS OF THE INVENTION

It is an object of this invention to provide a method and apparatus for analyzing a waveform which overcomes some of the problems and shortcomings of the prior art.

Another object of this invention is to provide a method and apparatus for analyzing a waveform which takes actual "point" samples anywhere along a waveform.

Another object of this invention is to provide a method and apparatus for analyzing a waveform which precisely measures pulse width.

Yet another object of this invention is to provide a method and apparatus for analyzing a waveform which samples a waveform at any one or several points anywhere along the waveform.

Another object of this invention is to provide a method and apparatus for analyzing a waveform which enables determination of a wide variety of waveform parameters.

Still another object of this invention is to provide a method and apparatus for analyzing a waveform which is readily integrated with an environmental test system for stress-testing printed circuit boards. How these and other objects are accomplished will be apparent from the following descriptions and from the drawing.

SUMMARY OF THE INVENTION

While the invention has broad application in the field of electronics, it is particularly useful when testing electronic printed circuit boards, the design characteristics of which are generally known. The invention helps determine whether waveforms originating on the boards (and which are expected to repetitively recur) have the shape, amplitude and other parameters, e.g., pulse width, as expected. If not, there is at least a possibility of a hardware or software flaw.

The new method relates to analyzing an electrical waveform portrayed on a graph. One aspect of the method involves determining the relationship of the waveform with respect to an area defined on the graph. Another aspect of the method involves using certain parts of the area boundary to initiate or terminate certain analytical activity such as determining waveform rise time, fall time, pulse width and/or other parameters. Each of these and other aspects are discussed below.

An aspect of the method includes the steps of selecting a waveform to be analyzed (if, as is often the case, there are multiple waveforms from which to choose) and establishing the boundary of an area on the graph, e.g., a small "window-like" space. A signal is generated, e.g., an error signal, if the waveform is in a predetermined position with respect to the area.

For example, the signal is generated if the waveform is to be outside the area but, in fact, is at least momentarily coincident with (i.e., on the boundary or within) the area. In the alternative, the signal is generated if the waveform is to be always within the area but, in fact, is outside the area. In the former case, one may say that the waveform is to be "passive" with respect to the area while in the latter, the waveform is to be "active" with respect to such area.

This feature is useful when monitoring a waveform which is to repetitively recur. If some portion of a waveform suddenly "wanders" into or out of the bounded area and such characteristic is not to occur, a signal can be provided which alerts the operator to a possible problem.

In a highly preferred method, the boundary is established by selecting a first point on the graph, such first point representing a first elapsed time. The signal generating step includes the step of sampling the waveform at a time equal to the first elapsed time. A second point is also selected on the graph and represents a second elapsed time and waveform sampling is terminated at a time equal to the second elapsed time. In other words, waveform sampling only occurs between two relatively-closely-spaced times but such sampling may occur more than once between such times. At least the first point or the second point is coincident with the boundary and, preferably, both points are coincident with the boundary.

In the preferred method, sampling is made to occur only during one or more relatively brief time spans. The method is also used to determine the instantaneous amplitude of the waveform at the time of each sample. Accordingly, the sampling step includes the steps of detecting the amplitude of the waveform and comparing the detected amplitude with a predetermined range of reference amplitudes. In one specific variation of the method, a signal (e.g., an error message) is generated if the detected amplitude is outside the range of reference amplitudes. In another version, the signal is generated if the detected amplitude is within the range of reference amplitudes.

It may be said that waveform analysis according to the method involves "analysis by exception." That is, no particular action is taken unless a waveform is "abnormal" with respect to a particular aspect.

The method may also be used for determining certain parameters, e.g., frequency, period and the like, of the waveform being analyzed. Such waveform may be said to be made up of a continuum of waveform points which are spaced in time. The method including the steps of selecting first and second points on the waveform and determining the time lapsed between points. Depending upon which points are selected, these steps may yield what is known as the "period" of the waveform (i.e., the time required for the waveform to make one complete cycle), the rise time, the fall time or the like.

In a variation, the step involving selecting the first point includes determining the amplitude of the first point and the step involving selecting the second point includes determining the amplitude of the second point. The difference in amplitude between the first point and the second point is then determined.

If, for example, the first and second points are low and high points, respectively, on the waveform, the method yields the rise time. If such points are the high and low points (in that order), the method yields the fall time.

In another aspect of the invention, the step involving selecting the first point includes establishing a graphic boundary which circumscribes the first point. This aspect of the invention might (in the vernacular) be referred to as "sampling what's inside the box" which may be a waveform point or may be the absence of a waveform. The boundary defines what might be referred to as a very small area or "window" which, preferably, is shaped like a polygon, e.g, a square or rectangle. (In this specification, the term "circumscribe" means to surround by a boundary, not necessarily a circular boundary.)

As will be seen, a square or rectangular boundary is preferred since each of its four corners can be "identified" by an "X" coordinate and a "Y" coordinate on a two-dimensional graph. To put it another way, the graph has an "X" axis and each of the plural points to be sampled has a time-related "X" coordinate. That is, the point is some distance along the "X" axis which means that such point is to occur at a predetermined time after the occurrence of a trigger signal.

The first point is at an "X" coordinate representing an event time and the boundary establishing step includes the step of selecting a first sample time and a second sample time with respect to the "X" axis. The first sample time is earlier than the event time and the second sample time is later than the event time. Sampling occurs at one or more times between the first and second sample times.

The graph also has a "Y" axis and each of plural points has an amplitude-related "Y" coordinate and the first point is at a "Y" coordinate representing an amplitude. The boundary establishing step includes the step of selecting a first sample amplitude and a second sample amplitude with respect to the "Y" axis. The first sample amplitude is less than the amplitude of the first point and the second sample amplitude is greater than the amplitude of the first point.

Other aspects of the invention involve a waveform analyzing apparatus. Such apparatus includes an analog section having a terminal for inputting at least one waveform. A central processing section (sometimes referred to as a central processing unit or "CPU") controls the operation of the analyzer. An interface board is electrically interposed between the analog section and the central processing section and such board exchanges signals between those sections.

The analog input board has a trigger circuit periodically initiating measurement of time. That is, a particular time increment begins upon occurrence of a trigger signal which may originate externally or within the apparatus. The interface board has a sampling circuit for determining the value of the waveform at that instant when the measured time is equal to a predetermined time. The waveform is said to thereby be "sampled."

Further details of the invention are set forth in the following detailed description and in the drawing.

DETAILED DESCRIPTIONS OF THE PREFERRED EMBODIMENTS

This description first sets out an exemplary test chamber system with which the new method and apparatus 10 are particularly useful. The details of the methodology are then explained.

Following the methodology is an overview of the "hardware" aspects of the analyzer 10. This overview is followed by a more detailed description of analyzer operating sections 33, 55, 53.

Test Chamber System

Figure 1:
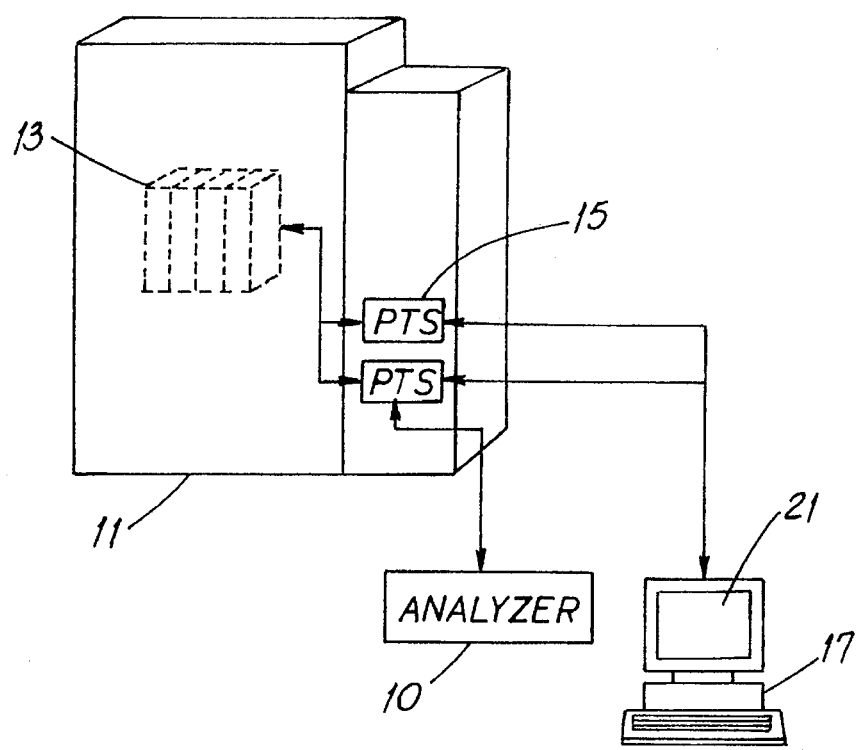
FIG. 1 is a symbolic view of the inventive analyzer shown in conjunction with a representative view of an environmental test chamber and associated computer for testing printed circuit boards. Parts are shown in dashed outline.

Referring to FIG. 1, an exemplary application for the new method and waveform analyzing apparatus 10 (although certainly not the only application) involves what is known as an environmental test chamber 11. The interior temperature of the chamber 11 can be made to change between, say, −50° F. and 135° F. on a cyclical basis in a matter of minutes.

Such chamber 11 is used to "stress screen" a number of electronic printed circuit boards 13 intended for use in critical applications. Often, all of the boards 13 in the chamber 11 are identical to one another. The idea behind such testing is that boards 13 which successfully "pass" such screening are likely to provide continued service in, for example, fighter aircraft which may climb from a hot desert airfield to very cold atmosphere in a matter of minutes.

In a known arrangement, the chamber 11 is used in conjunction with an electronic product test system (PTS) 15 and a host computer 17. The new analyzer 10 is coupled to the PTS 15. The system operator is aware that various circuit locations on such boards 13 are each supposed to exhibit a regularly-recurring waveform having generally known or predicted characteristics.

Methodology

Using the new analyzer 10 and method, the operator can extract information about the waveform 19 and monitor whether such waveform 19 has certain predicted characteristics. If it does not, this may be a good indication that the board 13 is defective in some way.

Figure 3:
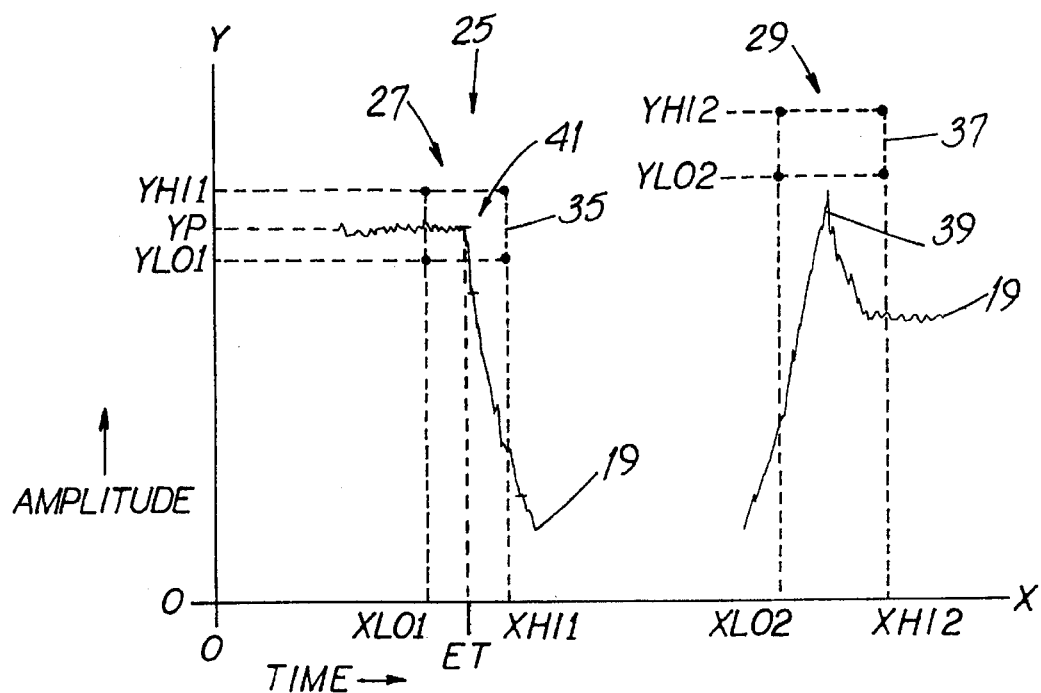
FIG. 3 is a graph showing aspects (enlarged) of the waveform of FIG. 2.
Figure 2:
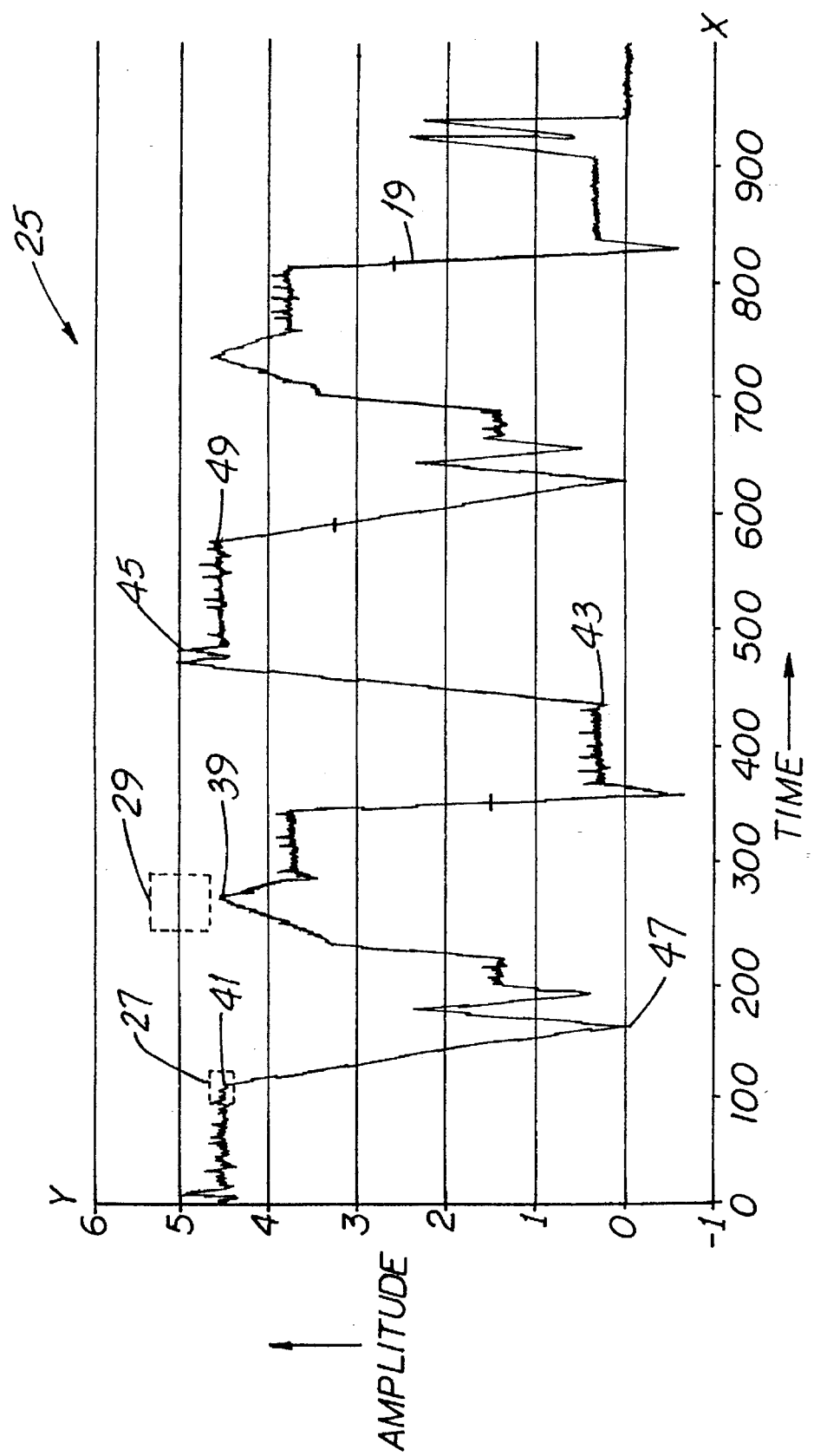
FIG. 2 is a graph showing a representative waveform to be analyzed.
Figure 5A:
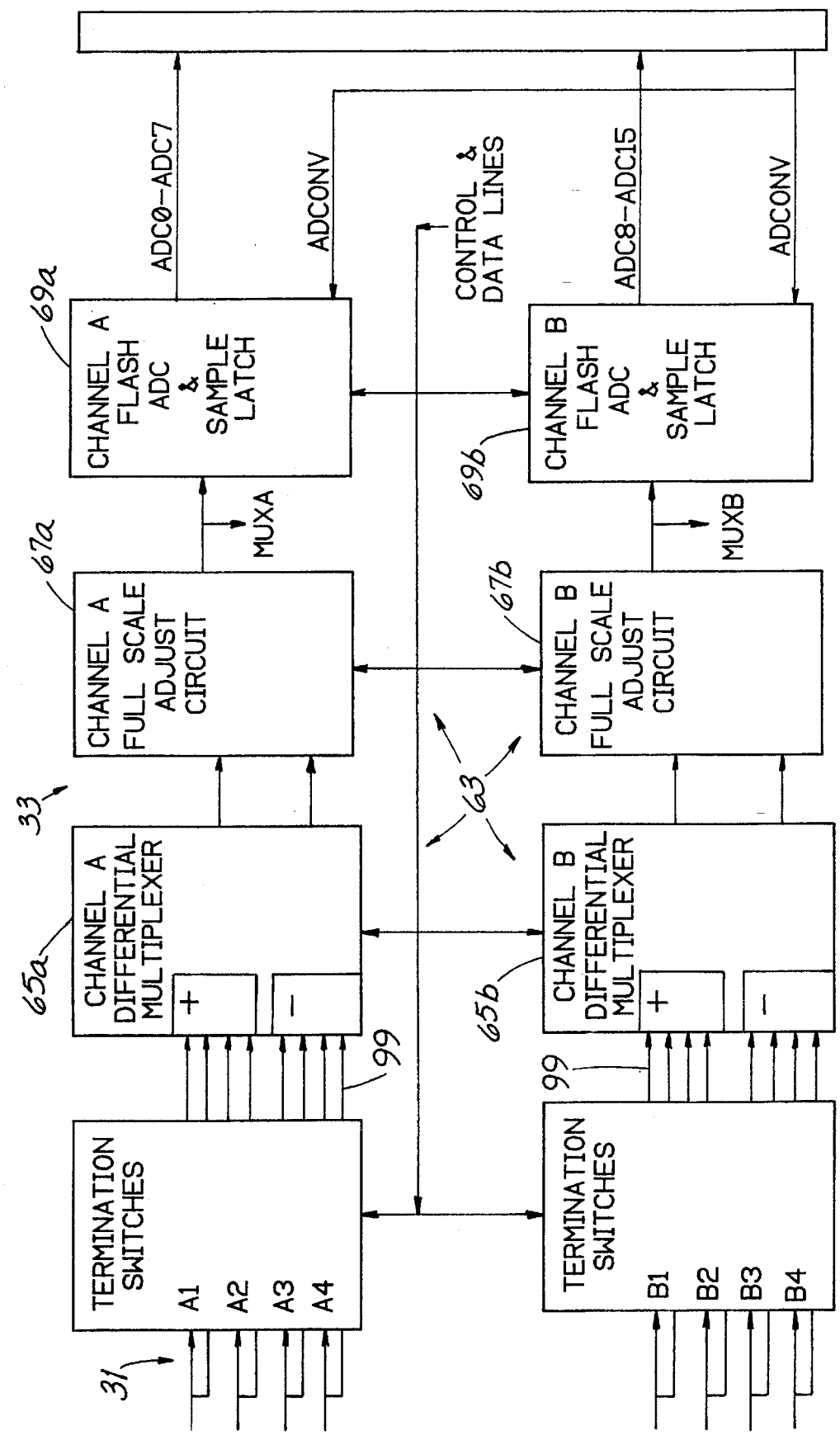
FIGS. 5A and 5B comprise a block circuit diagram of the analog section of the apparatus of FIG. 4.

Referring also to FIGS. 2, 3 and 5A, it is assumed that the operator of the test arrangement wishes to analyze some aspect of a waveform 19 being displayed in graphic form on the screen 21 of the computer 17. The graph 25 has a horizontal or "X" axis which, reading from left to right, denotes elapsed time counting from some zero time. How such zero time is determined is described below. Such graph 25 also has a vertical or "Y" axis which, reading from bottom to top, denotes amplitude, e.g, voltage or current value.

One aspect of the method involves determining the relationship of the waveform 19 with respect to an area 27, 29 defined on the graph 25. The operator selects a waveform 19 to be analyzed from among multiple waveforms from which to choose. S/he does so by selecting a channel input terminal 31 to the analog section 33. For purposes of this explanation, it is assumed that the illustrated waveform 19 is that which is supposed to regularly recur rather than one which is an aberration and has characteristics suggesting a defect in a board 13.

A boundary 35, 37 of an area 27, 29 on the graph 25, e.g., a small "window-like" space, is also established. As shown in FIGS. 2 and 3, the operator may establish two such areas 27, 29. The exemplary area 27 is established by selecting two "X" axis coordinates, i.e., XLO1 and XHI1, each of which represents a different time starting from the zero point. Two "Y" axis coordinates are also selected, i.e., YLO1 and YHI1, and such "Y" axis coordinates represent two different amplitudes measured from the zero point.

Similarly, another exemplary area 29 is established by selecting two "X" axis coordinates, i.e., XLO2 and XHI2, each of which represents a different time starting from the zero point. Two "Y" axis coordinates, i.e., YLO2 and YHI2, are also selected. As is now apparent, a square or rectangular boundary 35, 37 is preferred since each of its four corners can be "identified" by an "X" coordinate and a "Y" coordinate on a two-dimensional graph 25.

Each area 27, 29 is established to generate a signal such as an error signal if the waveform 19 (and, often, a particular point on the waveform) in a predetermined position with respect to the area 27, 29. More specifically, the area 29 is established with the knowledge that the point 39 of the waveform 19 is to be outside the area 29. However, if the waveform 19 is at least momentarily coincident with the area 29 (on the boundary 37 or within such area 29), i.e., if the point 39 of the waveform makes an incursion into the area 29, it is likely that the board 13 which is the source of the waveform 19 is defective. One may say that in the form in which it is supposed to occur, the waveform 19 is to be passive with respect to the area 29.

On the other hand, the area 27 is established with the knowledge that the point 41 of the waveform 19 is to be within the area 27. The signal is generated if the point 41 of the waveform 19 wanders outside the area 27. In this latter case, one may say that the waveform 19 is to be active with respect to such area 27.

These aspects of the methodology are based on the idea that certain useful analytical information can be obtained by merely ascertaining whether or not a waveform 19 or a point 39, 41 of a waveform 19 is or is not present in a particular small area 29, 27. This may be said to be a qualitative aspect of the new method.

The matter of boundary establishment and selection of waveform points 39, 41 to be sampled and analyzed can be viewed another way. Selecting a first point, e.g., point 41, 39 on the waveform 19 includes establishing a graphic boundary 35 which circumscribes a waveform point 41. This aspect of the invention might be referred to (in the vernacular) as "sampling what's in the box." The very small area 27 or 29 defined by the boundary 35 or 37 is preferably, is shaped like a polygon. However, in this specification, the term "circumscribe" means to surround by a boundary, whether polygonal, circular or otherwise.

Other aspects of the method may be said to be quantitative in nature. That is, they involve obtaining a waveform value rather than merely determining whether a waveform 19 is or is not present in a particular area 27, 29 of the graph 25.

Considering further the "point within a box" concept, each of one or plural points to be sampled has a time-related "X" coordinate representing an "event time." That is, the point is some distance along the "X" axis, i.e., is at a predetermined time after "time zero." As further described below, "time zero" represents the occurrence of a trigger signal.

As shown in FIG. 3, the point 41 is selected for sampling and such point 41 occurs at an event time "ET" and has an amplitude "YP." When establishing the boundary 35 around the point 41, first and second sample times (like times XLO1 and XHI1) are, respectively, earlier than the event time and later than the event time. Sampling occurs at one or more times between the first and second sample times. Similarly, the first and second sample amplitudes (like amplitudes YLO1 and YHI1) are, respectively, less than and greater than the amplitude of the first point 41.

From the foregoing, it is apparent that at least the first coordinate XLO1 or the second coordinate XHI1 is coincident with the boundary 35 and, preferably, all coordinates XLO, XHI, YLO and YHI are coincident with the boundary 35. The apparatus 10 and method are much easier to use when coordinates and boundaries are coincident. However, it is possible that, by rather intricate software (computer programming) one could "define" a coordinate to be other than coincident with a boundary. That variation is contemplated by the invention.

Returning again to the matter of establishing an area boundary, a boundary is established by selecting first and second points on the graph, e.g., XLO1 and XHI1, which represent first and second elapsed times, respectively. The signal generating step includes the step of sampling the waveform 19 at a time equal to the first elapsed time XLO1 and terminating such sampling at a time equal to the second elapsed time XHI1.

In other words, waveform sampling only occurs between two relatively-closely-spaced times, XLO1 and XHI1 in the example. However, such sampling may occur more than once between such times. The new apparatus 10 is capable of sampling at a rate of once each 50 nanoseconds or once each 500 nanoseconds, depending upon particular apparatus configuration.

The preferred method is also used to determine the instantaneous amplitude of the waveform 19 at the time of each sample. Accordingly, the sampling step includes the steps of detecting the amplitude of the waveform 19 by sampling such waveform at, say, the coordinate YP which is coincident with point 41. The detected amplitude is compared with a predetermined range of reference amplitudes.

In one specific variation of the method, a signal (e.g., a failure interrupt) is generated if the detected amplitude is outside the range of reference amplitudes. The failure interrupt signal is routed to the PTS 15 and includes the date of failure, address, time of occurrence and other information. In another version, the signal is generated if the detected amplitude is within the range of reference amplitudes.

Relating this to FIG. 3, a signal is generated if the detected amplitude of point 41 is outside the range of reference amplitudes YLO1 and YHI1. Considering point 39, a signal is generated if the detected amplitude of point 39 is within the range of reference amplitudes YLO2 and YHI2.

It may be said that waveform analysis according to the method involves "analysis by exception." That is, no particular action is taken unless a waveform 19 is "abnormal" with respect to a particular aspect.

Referring particularly to FIG. 2, the method may also be used for determining certain parameters, e.g., frequency, period and the like, of the waveform 19 being analyzed. The method includes the steps of selecting first and second points on the waveform 19 and determining the time lapsed between points. Depending upon which points are selected, these steps may yield what is known as the "period" of the waveform (i.e., the time required for the waveform to make one complete cycle), the rise time, the fall time or the like.

As specific examples (and assuming that the time lapse between the points of each of the following pairs of points is determined), selection of points 43 and 45 provides the rise time, selection of points 41 and 47 provides the fall time, selection of points 41 and 49 provides the period, selection of points 45 and 49 provides the pulse width and selection of points 39 and 45 provides the frequency. (It should be noted that the waveform 19 under consideration has two dips and rises for each complete waveform replication. One complete replication has two "cycles," thus indicating points 39 and 45 to obtain frequency.

As to the determination of rise time, it is to be noted that points 43 and 45 are points where the waveform 19 is at a low and a high amplitude, respectively. Amplitude determination and the difference in the amplitude (in the case of rise time computation, the maximum difference) is needed to determine the parameter.

Analyzer "Hardware" Overview

Figure 4:
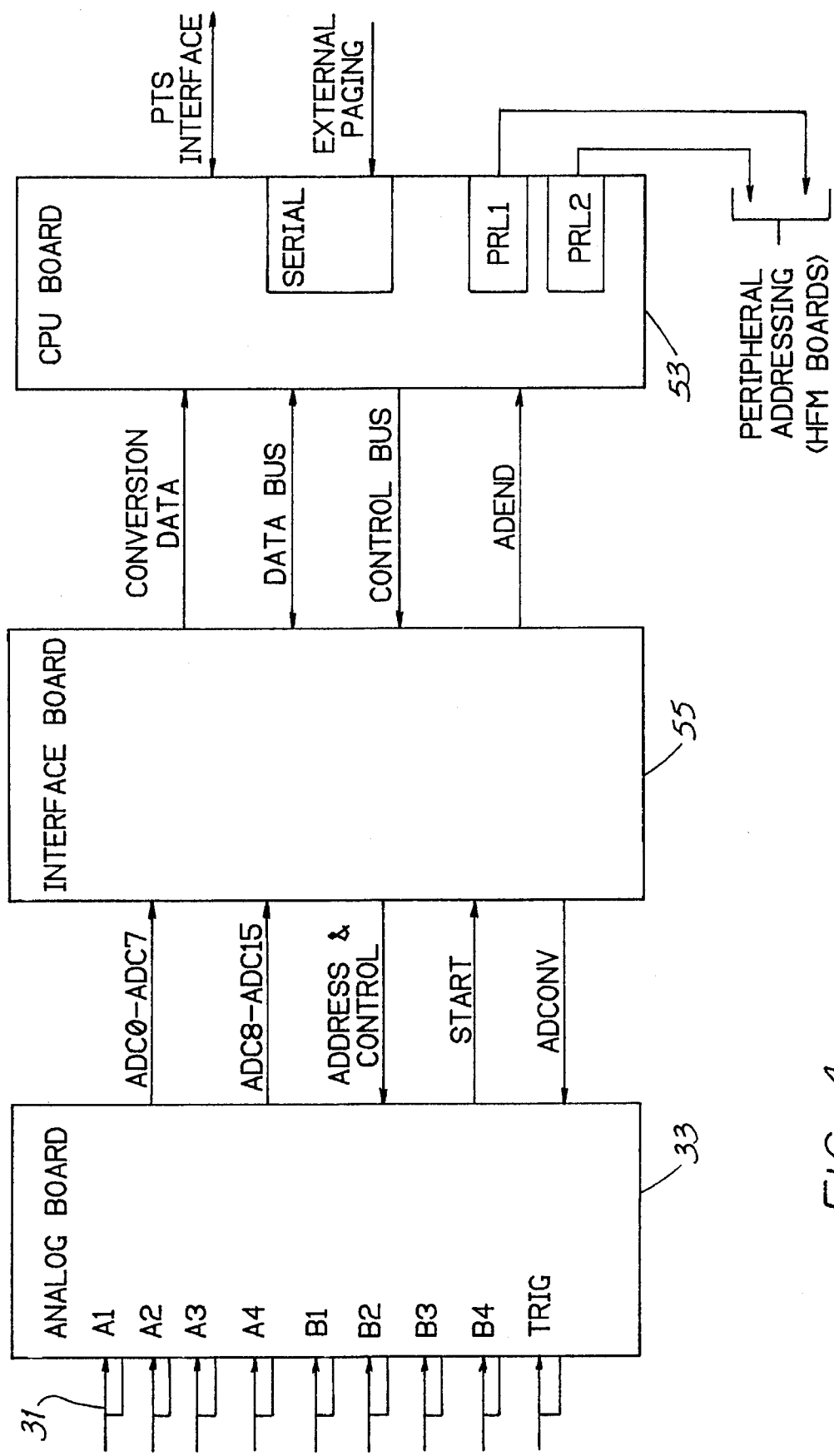
FIG. 4 is a block circuit diagram of the inventive analyzer apparatus.

Other aspects of the invention involve the waveform analyzing apparatus 10. Referring to FIG. 4, such apparatus 10 includes an analog section 33 having several terminals 31, each for inputting a separate waveform 19. A central processing section 53 (sometimes referred to as a central processing unit or "CPU") controls the operation of the analyzer 10. An interface section 55 is electrically interposed between the analog section 33 and the central processing section 53 and such board exchanges signals between those sections 33, 53.

Analog Input Section

Figure 5B:
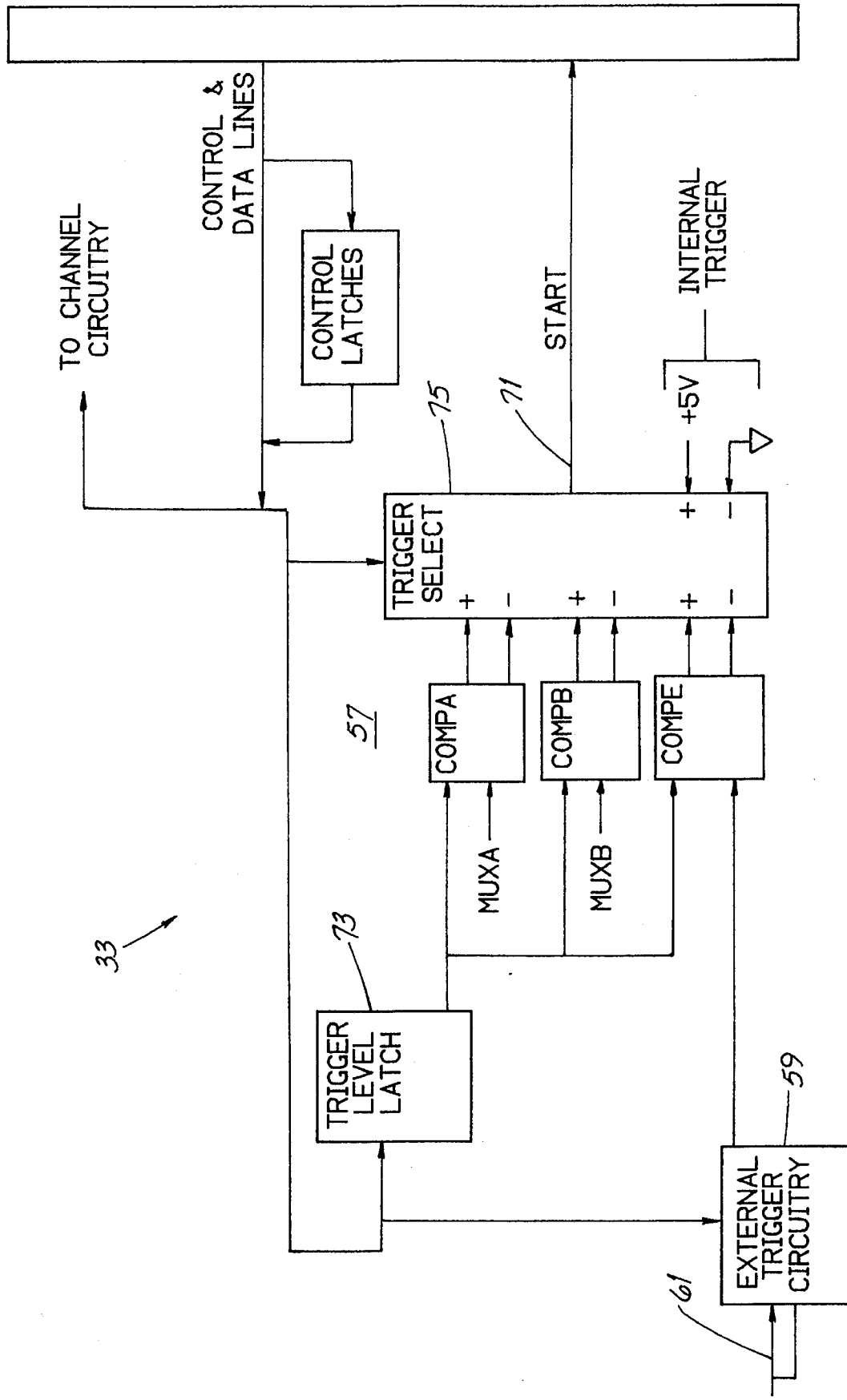

Referring also to FIGS. 5A–5B, the analog input section 33 has a trigger circuit 57 periodically initiating measurement of time. "Time zero" (represented by the point with respect to the "X" axis), is coincident with the occurrence of the trigger signal. That is, a particular time increment begins upon occurrence of a trigger signal and such signal may originate externally via the circuit 59 or within the apparatus 10. It should be noted that when internal triggering is used, the trigger starts the timing at a selected amplitude point along the "Y" axis as well.

More specifically, the analog section 33 can accept eight different waveforms 19, one at each of the coaxial inputs 31 identified A1–A4, B1–B4. There is also an input 61 for an external trigger signal. By using an external multiplexer coupled to the inputs 31, thousands of different waveforms 19 can be monitored. The analog section 33 provides all the channel circuitry and trigger circuitry 57, 59 and, in addition, it digitizes the analog waveform samples before sending them to the interface section 55.

The input channel circuits 63 provide signal conditioning, selection, and multiplexing for the input channel waveforms. Such channel circuits are described below. The waveforms 19 are applied to the differential multiplexers 65 and control signals from the central processing section 53 select the same numerical address (1 thru 4) from the channel A and B multiplexers 65a and 65b, respectively. The selected signal pair is applied to the Channel A and B full scale adjust circuits 67a and 67b, respectively.

Each full scale adjust circuit 67 divides the amplitude of the waveform 19 by a programmed number to meet the full scale requirement for that channel. Specifically, each circuit divides the waveforms to display a full scale of 5, 2.5, 1, or 0.5 volts.

The scaled waveform 19 is applied to the analog-to-digital converter and latch circuits 69a, 69b for sampling. Each of the latter circuits 69 converts and traps a sample of the amplitude of the waveform 19 for each programmed sample time. And for each sample time, the resulting converted data is routed to the interface section 55 for storage.

The trigger circuits 57 apply an external or internal trigger to the START line 71 for the waveform monitoring. That determines when the clock starts running from "zero time" and, in graphic terms, time starts running down the "X" axis. The analog section 33 applies the output from the channel A differential multiplexer 65a (designated "MUXA") is applied to the amplifier/comparator COMPA. Similarly, the output from the Channel B differential multiplexer (such output being designated "MUXB") to the amplifier/comparator COMPB.

The trigger level latch 73 outputs a programmed voltage level to each of the trigger amplifiers COMPA, COMPB and COMPE. The positive and negative outputs from such amplifiers COMPA, COMPB and COMPE are applied to the trigger select circuit 75. Such circuit 75 selects the trigger input according to the programmed trigger source and trigger slope entries made by the operator in an analyzer profile. When the selected comparator signal becomes active, the trigger circuit sends a START signal to the interface section 55.

The Interface Section

Figure 6A:
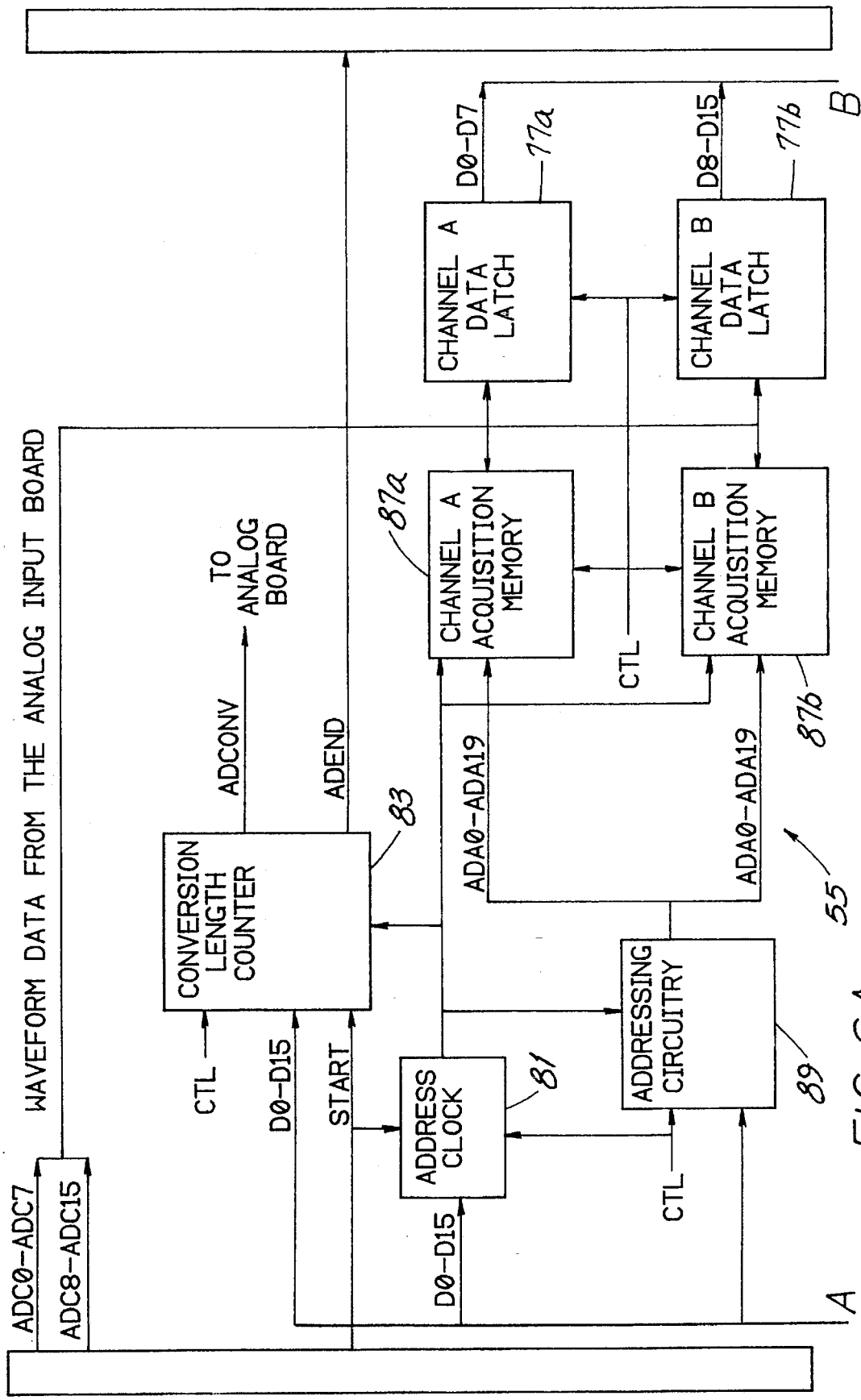
FIGS. 6A and 6B comprise a block circuit diagram of the interface section of the apparatus of FIG. 4.
Figure 6B:
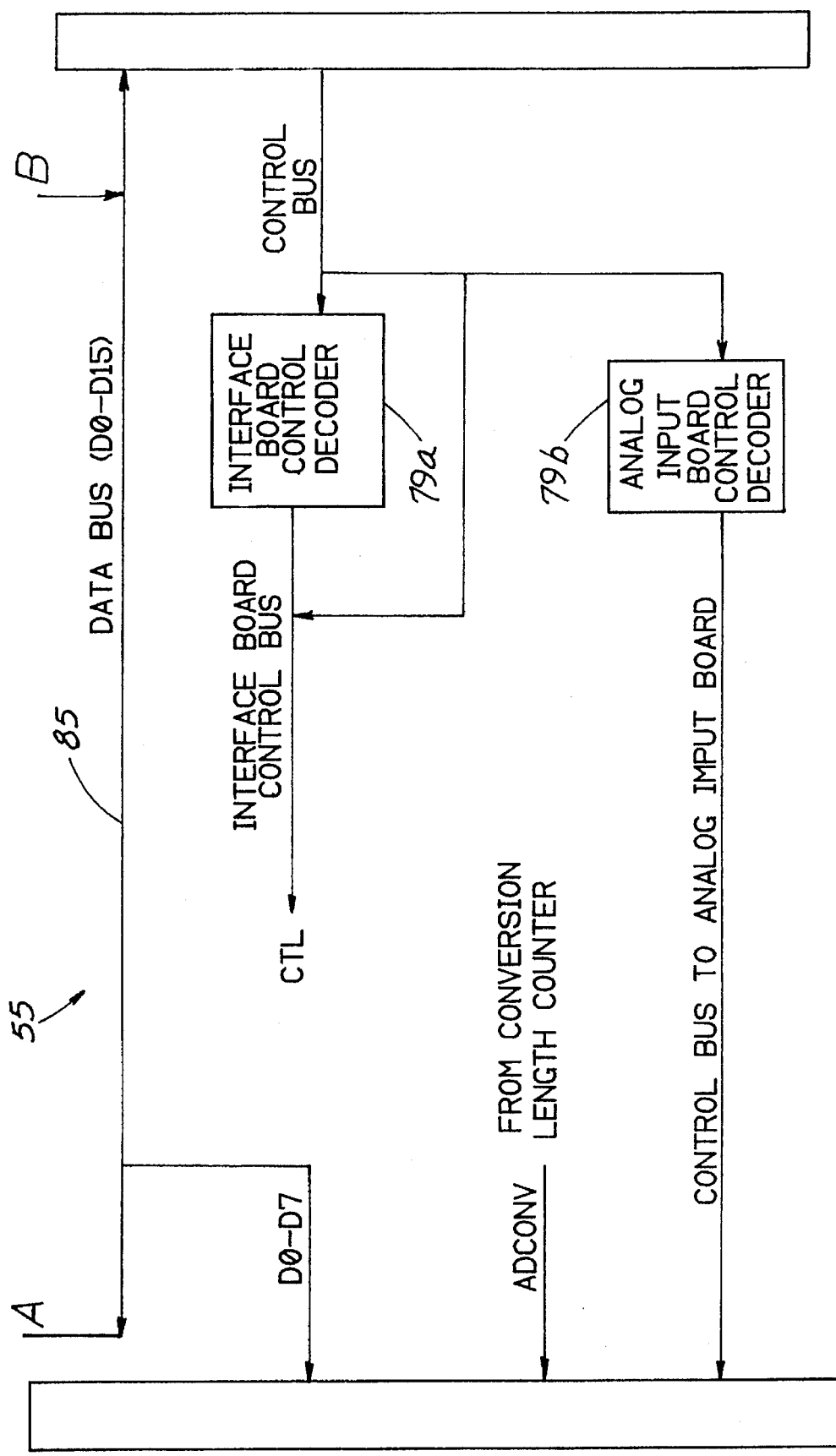

Referring now to FIGS. 6A and 6B, the interface section 55 has latch circuits 77 and decoder circuits 79 which communicate with the central processing section 53. Such latch circuits 77 and decoder circuits 79 decode the data and control signals from the central processing section 53 for use in the analog section 33 and in the interface section 55.

The address clock 81 provides timing for the addressing circuitry and the conversion sampling process. Such clock 81 stores the programmed sample rate and generates the clock signals for the interface section 55. The clock 81 starts when the trigger select circuit 75 of the analog section 33 sends a START signal.

The conversion length counter 83 stores the programmed number of samples for the current monitor point such as the point 41 which has a position relationship to a window-like area such as areas 27, 29. The counter 83 sends the ADCONV signal to the conversion circuits 69 of the analog section 33. Such ADCONV signal "traps" a signal representing a waveform point (e.g., point 41) from each channel and latches such signal onto the ADC bus 85 for storage in the acquisition memory 87 of the interface section 55.

The counter 83 sends the ADEND signal to the central processing section 53 when the time during which sampling occurs is equal to a pre-programmed second elapsed time, e.g., XHI1. The central processing section 53 then determines if the amplitude of the sampled value is inside or outside the programmed limits.

The addressing circuit 89 includes a start addressing latch which provides the first storage address for each monitored area like area 27. The acquisition memory circuit 87 stores the converted data samples from the conversion. Such memory circuit 87 provides 60K bytes of storage per channel input 31. The channel A and channel B data latches 77a, 77b place the converted sample data on the data bus 85 to the central processing section 53.

The counter 83 signals the A/D converter 69 as to when to "take" a sample of the instantaneous value of the waveform 19 at that instant when the measured time is equal to a predetermined time. Putting it another way, the time at which sampling starts and ends is programmable and under the control of the operator. The waveform 19 is said to thereby be "sampled." Such sampled data is sent by the analyzer 10 along the interface bus to the PTS host computer 17 for graphic display on the screen 21.

The Central Processing Section

Figure 7:
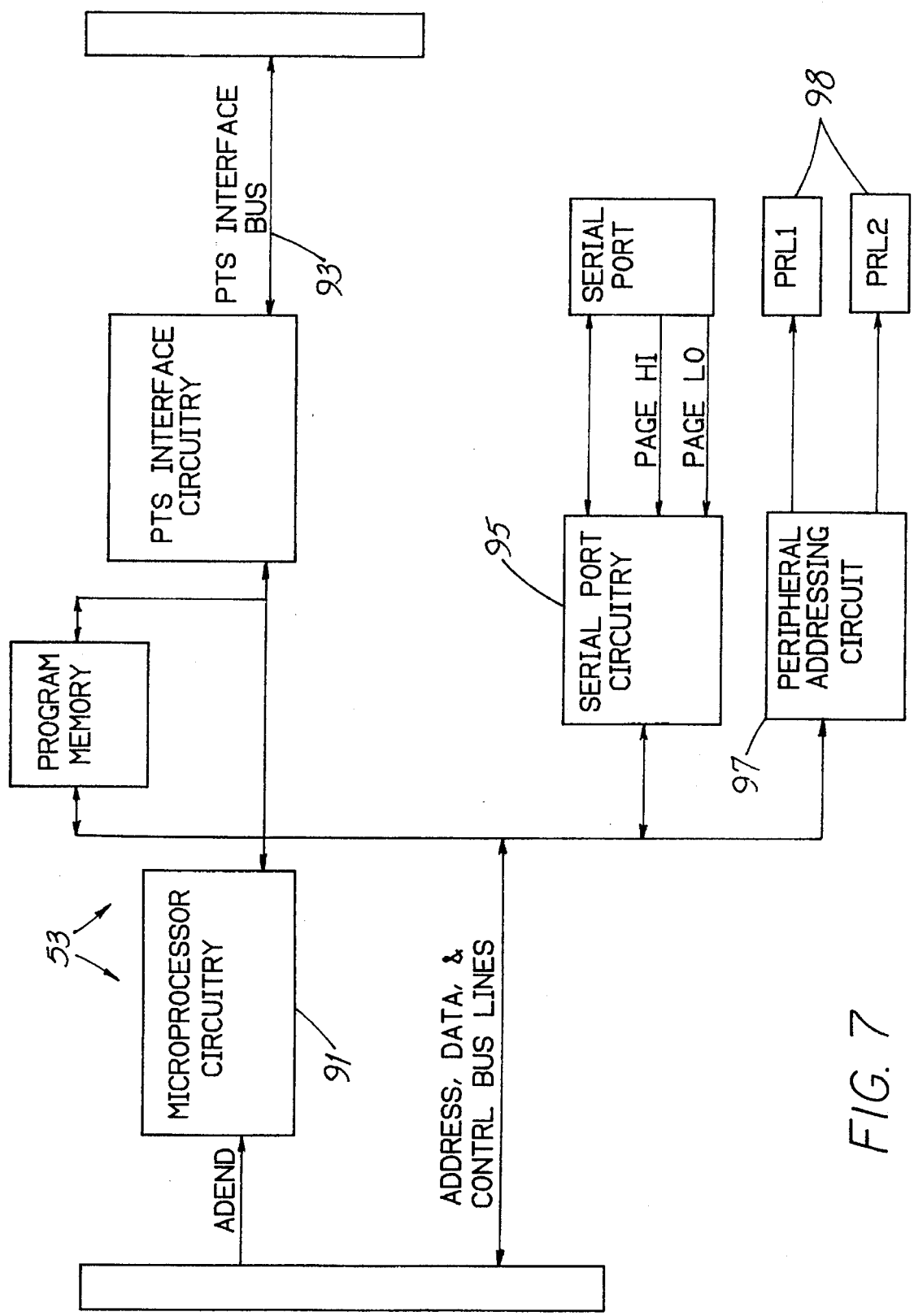
FIG. 7 is a block circuit diagram of the central processing section of the apparatus of FIG. 4.

Referring to FIG. 7, the central processing section 53 addresses the acquisition memory circuit 87 and reads the conversion data for the window-like area 27 of each monitored point 41. Such section 53 checks the conversion data against the pre-programmed "Y" axis amplitudes, e.g., YLO1 and YHI1, for an out-of-limits failure. In addition, the section 53 sends the sample data to the host computer 17 for display on the screen 21.

The microprocessor 91 operates the apparatus 10 according to instructions in memory. Operating and limit parameters are received along the interface bus 93 from the PTS host computer 17. The section 53 reads the sampled data for each monitored point area 27 to make sure the waveform 19 is within the proper limits or outside the specified limits, as the case may be. If a failure is detected, the section 53 sends a failure interrupt to the host computer 17 which displays the failure and stores it in the failure files.

The serial port circuit 95 provides a serial communications interface and paging for the analyzer 10. Paging inputs allow an external device (e.g., a digital waveform generator) to cause the analyzer 10 to page the waveform parameters to the next set of signals. The section 53 then accesses the stored parameters and continues its operation. The peripheral addressing circuit 97 provide sixteen address lines 98 for additional multiplexing. The central processing section 53 synchronizes these lines 98 with the differential multiplexer address lines 99 of the analog section 33.

While the principles of this invention have been described in connection with specific embodiments, it should be understood clearly that these descriptions are made only by way of example and are not intended to limit the scope of the invention.

What is claimed:

1. A method for stress-screening a circuit board by analyzing a circuit board waveform having waveform points which are spaced in time, the method including the steps of:

placing the circuit board in a test chamber;

displaying the circuit board waveform on a graph;

establishing a first graphic boundary circumscribing a first point on the waveform;

establishing a second graphic boundary circumscribing a second point on the waveform; and generating an error signal if one of the points moves outside its graphic boundary.

2. The method of claim 1 wherein the generating step includes generating an error signal if the first point moves outside the first graphic boundary.

3. The method of claim 1 wherein the generating step includes generating an error signal if the second point moves outside the second graphic boundary.

4. The method of claim 1 wherein the generating step includes generating an error signal if both the first and second points move outside the first and second graphic boundaries, respectively.

5. The method of claim 1 wherein:

the graph has an "X" axis;

the first point has a time-related "X" coordinate representing an event time;

and the boundary establishing step includes the step of:

selecting a first sample time and a second sample time with respect to the "X" axis; and the first sample time is earlier than the event time and the second sample time is later than the event time.

6. The method of claim 1 wherein:

the graph has a "Y" axis;

the first point has an amplitude-related "Y" coordinate representing an amplitude;

and the boundary establishing step includes the step of:

selecting, with respect to the "Y" axis, a first sample amplitude and a second sample amplitude, and wherein:

the first sample amplitude is less than the amplitude of the first point and the second sample amplitude is greater than the amplitude of the first point.

* * * * *